United States Patent [19]

Siegel, Jr. et al.

[11] Patent Number: 5,521,502

[45] Date of Patent: May 28, 1996

[54] FLOW DIFFERENTIATION SCHEME FOR MAGNETIC RESONANCE ANGIOGRAPHY

[75] Inventors: John M. Siegel, Jr., Atlanta; David N. Ku, Decatur, both of Ga.

[73] Assignee: Georgia Tech Research Corporation, Atlanta, Ga.

[21] Appl. No.: 232,377

[22] Filed: Apr. 25, 1994

[51] Int. Cl.$^6$ .................................................. G01R 33/48
[52] U.S. Cl. ...................... 324/306; 128/653.2; 324/309
[58] Field of Search .................................. 324/306, 300, 324/307, 309; 128/653.3, 653.2

[56] References Cited

U.S. PATENT DOCUMENTS

| | | | |
|---|---|---|---|
| 4,609,872 | 9/1986 | O'Donnell | 324/306 |
| 4,777,957 | 10/1988 | Wehrli et al. | 324/306 |
| 4,788,500 | 11/1988 | Patz et al. | 324/306 |
| 4,896,113 | 1/1990 | Pelc | 324/309 |
| 4,954,779 | 9/1990 | Zur | 324/306 |
| 4,962,763 | 10/1990 | Sato et al. | 324/306 |
| 4,973,906 | 11/1990 | Bernstein | 324/309 |
| 5,034,694 | 7/1991 | Sattin et al. | 324/306 |
| 5,038,784 | 8/1991 | Dumoulin | 324/306 |
| 5,070,876 | 12/1991 | Wright | 128/653.3 |
| 5,148,109 | 9/1992 | Takane et al. | 324/309 |
| 5,151,655 | 9/1992 | Harms et al. | 324/309 |
| 5,160,889 | 11/1992 | Scheidegger et al. | 324/309 |
| 5,185,574 | 2/1993 | Ehman et al. | 324/309 |
| 5,204,625 | 4/1993 | Cline et al. | 324/306 |
| 5,394,872 | 3/1995 | Takiguchi et al. | 324/306 |

OTHER PUBLICATIONS

John Oshinski; Use of Magnetic Resonance Imaging To Evaluate Stenotic Flows; Georgia Institute of Technology Feb. 1993; pp. 1–175.

Gatenby, McCauley, Gore; Investigation Using Partial Echo Techniques Of Post–Stenotic Signal; Dept. of Diagnostic Radiology Yale University; p. 364.

Gatenby, Gore; Measurement Of Turbulent Intensity Using Partial Echo Techniques; Dept. of Diagnostic Radiology Yale University; p. 2914.

Schmalbrock et al.; volume MR Angiography: Methods To Achieve Very Short Echo Times; Radiology; 175:861–865.

Axel et al.; Use Of An Implanted Flowmeter For In–Vivo Calibration Of MRI Flow Measurements; Radiology Dept., Hospital of the University of Pennsylvania; pp. 52–53.

De Gennes; Theory Of Spin Echoes In A Turbulent Fluid; Physics Letters; vol. 29A, No. 1, 24 Mar. 1969.

Fukuda et al.; A Pulsed NMR Study On The Flow Of Fluid; Journal of the Physical Society of Japan, vol. 47, No. 6 Dec., 1979; pp. 1999–2006.

Mirowitz et al.; "Pseudocoarctation" Of The Aorta: Pitfall On Cine MR Imaging; J. Comput. Assist. Tomoger, vol. 14, No. 5, 1990; pp. 753–755.

Simpson et al.; Cine Magnetic Resonance Imaging For Evaluation Of Anatomy And Flow Relations In Infants And Children With Coarctation . . . ; vol. 78, No. 1, Jul. 1988.

(List continued on next page.)

*Primary Examiner*—Sandra L. O'Shea
*Assistant Examiner*—Raymond Y. Mah
*Attorney, Agent, or Firm*—Hopkins & Thomas; Scott A. Horstemeyer

[57] ABSTRACT

A flow differentiation scheme is disclosed for magnetic resonance imaging (MRI) of fluid flow in regions of turbulent flow. The flow differentiation scheme comprises the steps of (1) obtaining a first magnetic resonance (MR) image of the region, (2) obtaining a second MR image of the same region with an imaging parameter or imaging sequence altered, and (3) logically differentiating the first and second images with respect to flow to create a difference image. The process may be enhanced by superimposing one of the original images, upon an image that has been flow differentiated. As a result, a substantial amount of the static signal is suppressed producing superior angiograms of diseased and undiseased blood vessels. Additionally, the scheme can be used to image any fluid flow in any body or thing.

18 Claims, 4 Drawing Sheets

EXAMPLE OF FLOW DIFFERENTIATION USING A GRADIENT ECHO IMAGE (IMAGE 1) AND A SPIN ECHO IMAGE (IMAGE 2).

OTHER PUBLICATIONS

Rees et al.; App. Of Flow Measurements By Magnetic Resonance Velocity Mapping To Congenital Heart Disease; American Journal of Cardiology; Oct. 15, 1989, vol. 64.

Kose; Visualization Of Shear Distribution In Turbulent Fluids Using Echo–Planar Imaging; Institute Of Applied Physics Univ. of Tsukuba, Ibaraki 305, Japan (1994).

Kawabe et al.; A Note On The Signal Intensity Of The Second Spin Echo In Carr–Purcell–Meiboom–Gill Sequence Of Turbulent Flows; Jrnl of Phy. Soc. Japan; Apr. 25, 1983.

Evans et al.; Effects Of Turbulence On Signal Intensity In Gradient Echo Images; Investigative Radiology, Jul. 1988; vol. 23; No. 7; pp. 512–518.

Underwood et al.; Magnetic Resonance Of The Cardiovascular System; Blackwell Scientific Publications, 1991; Chapter 10; pp. 107–130.

Yucel, M.D., Magnetic Resonance Angiography; Perspective in Vascular Surgery; vol. 3; No. 1; 1990; pp. 35–51.

Krug et al.; MR Imaging Of Poststenotic Flow Phenomena: Experimental Studies; JMRI; vol. 1; No. 5; Sep./Oct. 1991; pp. 585–591.

Kuethe et al.; Fluid Shear And Spin–Echo Images; Magnetic Resonance in Medicine 10, 57–70 (1989); Dept. of Radiology, Duke University Medical Center, N.C.

Urchuk et al.; Mechanisms Of Flow–Induced Signal Loss In MR Angiography; JMRI; vol. 2; No. 4; Jul./Aug. 1992 2:453–462.

Kilner et al.; Valve And Great Vessel Stenosis: Assessment With MR Jet Velocity Mapping; Radiology 1991; 178: 229–235.

EXAMPLE OF FLOW DIFFERENTIATION USING A GRADIENT ECHO IMAGE (IMAGE 1) AND A SPIN ECHO IMAGE (IMAGE 2).

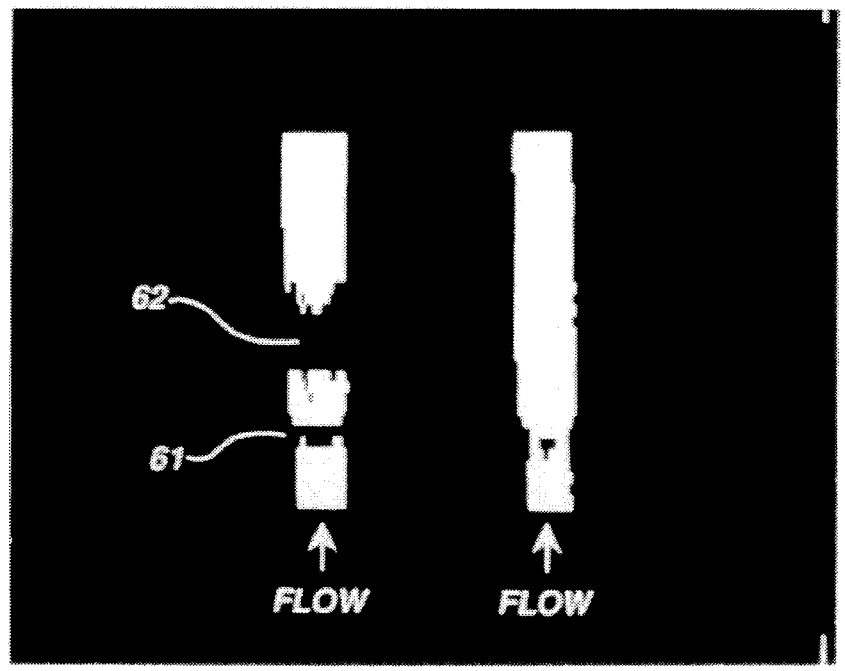
*FIG. 6A*   *FIG. 6C*
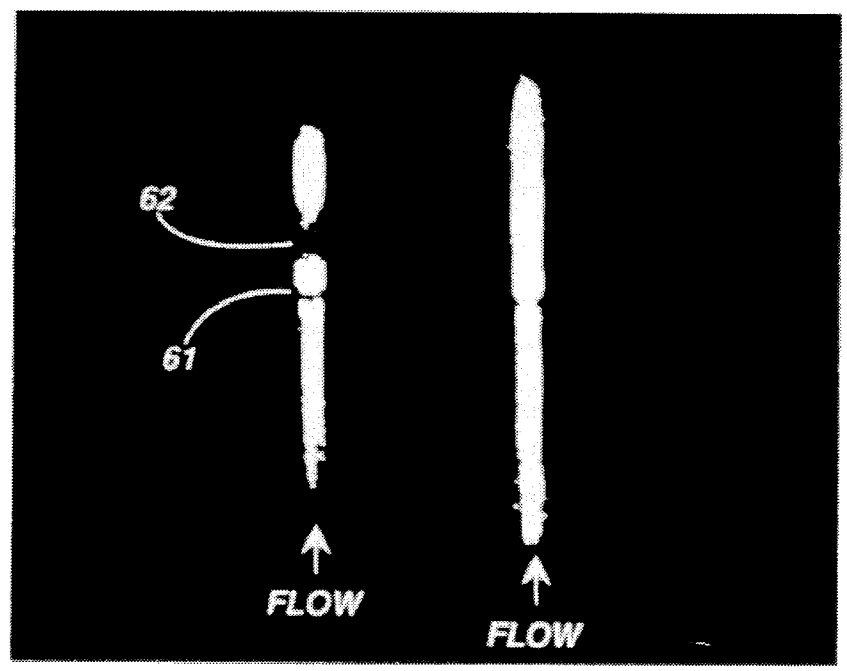
*FIG. 6B*   *FIG. 6D*

FLOW DIFFERENTIATION SCHEME FOR MAGNETIC RESONANCE ANGIOGRAPHY

FIELD OF INVENTION

The present invention generally relates to magnetic resonance imaging (MRI), and more particularly, to a process and system for eliminating flow-induced artifacts, or signal loss caused by turbulence, in MRI systems for imaging fluid flow. The present invention has particular application to MRI systems used for angiography, i.e., the analysis of blood vessels, which systems are sometimes referred to as magnetic resonance angiography (MRA).

BACKGROUND OF THE INVENTION

Complications from arterial diseases such as myocardial infarctions (MI) and cerebral vascular accidents (CVA) cause a majority of the deaths in the western world. The survival of a patient is highly dependent upon the early diagnosis and treatment of the stenotic lesions which characterize these diseases. Dye contrast X-Ray angiography has long provided an invasive means of imaging the arteries. Drawbacks of this procedure are its invasive nature and the potentially harmful exposure of the patient to ionizing radiation. Magnetic resonance angiography (MRA) was initially thought to be the answer to these problems. It is a non-invasive procedure, and the evidence to date is that the high magnetic fields pose no danger to human cells. However, all MRA imaging techniques in use today fail in the critical area of arterial disease detection. Massive signal loss occurs when imaging blood vessels having stenotic flow which is often encountered with arterial diseases, causing an overestimation of the extent of stenosis or even a misrepresenting of a diagnosis of total occlusion.

Magnetic resonance imaging (MRI) has the ability to isolate and differentiate moving protons from static protons. Therefore, MRI can identify fluid motion as a bulk of moving protons. It is this feature of MRI which makes possible the creation of MR angiograms, or pictures of arteries. Magnetic resonance (MR) angiograms are typically described as either being "black flow" or "white flow," The term black flow implies that the flowing fluid returns a low echo signal relative to the background signal level. The term white flow implies that the flowing fluid returns a high signal relative to the background. To obtain a greater understanding of this concept, see Richard Underwood & David Firmin, Magnetic Resonance of the Cardiovascular System, pp. 107–130 (1992).

Magnetic resonance angiograms provide useful images for many flow conditions such as laminar flow. However, MR white flow angiograms provide poor images of turbulent flow because in regions of highly turbulent flow the image appears dark, rather than light, making the geometry of the vessel indistinguishable from the dark background tissue. In particular, diseased arteries usually create a high level of acceleration and other abnormal physiologic flow patterns which can result in a whole length (10 diameter or more) of the artery appearing dark, creating the illusion of a blocked artery. This dark region is termed "signal loss." MR black flow angiograms experience similar problems in diseased vessels. Often arterial constrictions will produce a region of slowly moving fluid distal to the occlusion. This region appears white on a black flow angiogram, whereas the rest of the vessel will appear dark. In the context of this document, this error in MR angiograms is referred to as "signal loss." The major point is that signal loss occurs when the MR image loses its ability to differentiate between a moving fluid and the surrounding material.

Turbulent signal loss has been documented in a wide variety of flow geometries such as aortic coarctations (Simpson et al.,"Cine Magnetic Resonance Imaging for Evaluation of Anatomy and Flow Relations in Infants and Children with Coarctation of the Aorta," Circulation, v. 78, pp. 142–448 (1988); Mirowitz et al., "Pseudocoarctation of the Aorta: Pitfall on Cine MR Imaging," J Comput Assist Tomography, v. 14, pp. 753–754 (1990)), orifice flow (Evans et al., "Effects of Turbulence of Signal Intensity in Gradient Echo Images," Invest Radiology, v. 23, pp. 512–518 (1988)), and cosine shaped stenosis (Krug et al., "MR imaging of Poststenotic Flow Phenomena: Experimental Studies," JMRI, v. 1, pp. 585–591 (1991); Oshinski, "MRI of Stenotic Flows," PhD Thesis, Georgia Institute of Technology (1993)). A widely recognized means for decreasing the area of turbulent signal loss is reduction of the image echo time or the applied gradient duration. In this regard, refer to the following articles: Schmalbrock et al., "Volume MR Angiography: Methods to Achieve Very Short Echo Times," Radiology, v. 175, pp. 861–865 (1990); Kilner et at., "Valve and Great Vessel Stenosis: Assessment with MR Jet Velocity Mapping," Radiology, v. 178, pp. 229–235 (1991); Urchuk et al., "Mechanisms of Flow-induced Signal Loss in MR Angiography," JMRI, v. 2, pp. 453–462 (1992); Gatenby et al., "An Investigation using Partial Echo Techniques of Post-stenotic Signal Loss." 11th Annual SMRM Conference Abstracts, p. 364 (1991); and Gatenby et al., "Mechanisms of Signal Loss in MR Imaging of Stenoses," 12th Annual SMRM Conference Abstracts, p.2814 (1992). However, it is also widely recognized that conventional magnetic resonance imaging hardware limits the minimum echo time, and therefore, these systems cannot provide a small enough echo time to image diseased vessels in the human anatomy.

The theoretical explanations for signal loss vary with the gradient sequence used. One hypothesis assuming only velocity encoding is described in Nalcioglu et al., "Application of MRI in Fluid Mechanics of Turbulent Flow," 7th Annual SMRM Abstracts, p. 418 (1987). A second hypothesis with a partial gradient echo sequence is described in Gatenby et al., "Measurement of Turbulent Intensity using Partial Echo Techniques," 12th Annual SMRM Conference Abstracts, p.2815 (1992). Both suggest that the fluctuating component of velocity in turbulent flow causes an exponential decline in signal intensity. The same phenomena is said to occur on the even echoes of a multiple echo-spin echo sequence. See De Gennes, "Theory of Spin Echoes in a Turbulent Fluid," Physics Letters A, v. 29, pp. 20–21 (1969); Fukuda et al., "A Pulsed NMR Study on the Flow of Fluid," J. Physics Society of Japan, v. 47, pp. 1999–2006 (1979); and Kawabe et al., "A Note of the Signal Intensity of the Second Spin Echo in Carr-Purcell- Meiboom-Gill Sequence of Turbulent Flows," J. Physics Society of Japan. v. 52, pp. 2308–2311 (1983). Others argue that signal loss using spin-echo imaging, as discussed in Kuethe et al., "Fluid Shear and Spin-Echo Images," MRM, v. 10, pp. 57–70 (1989), or echo-planer imaging, as discussed in Kose, "Visualization of Shear Distribution in Turbulent Fluids Using Echo-Planar Imaging," 11th Annual SMRM Conference Abstracts, p. 362 (1991), can be caused by fluid shear stress.

In summary, there is no consistent explanation and solution for the signal loss seen in MR angiograms of diseased arteries. Likewise, no methods have been published which consistently eliminate the problem of signal loss in MR angiograms.

SUMMARY OF INVENTION

An object of the present invention is to overcome the deficiencies and inadequacies of the prior art as noted above and as generally known in the art.

Another object of the present invention is to provide an explanation for the relationship between signal loss in magnetic resonance (MR) images of turbulent flow and the signal from the image static material.

Another object of the present invention is to provide a process and system for producing MR images of fluid flow which significantly reduces signal loss.

Another object of the present invention is to provide a process and system for producing high angiographic images.

Another object of the present invention is to provide a process and system for producing accurate angiographic images of diseased blood vessels.

Another object of the present invention is to provide a process and system having the improved ability in MRI to suppress the signal of the static material.

Another object of the present invention is to provide a process for utilizing conventional MRI techniques to accurately and inexpensively produce images of stenotic flow in a vessel.

Briefly described, the present invention involves a discovery that the region of signal loss in a white flow angiogram of disturbed flow is actually a region where the signal from flowing protons is lower than the signal from the static tissue. The disturbed flow region may be caused by a number of factors such as turbulent flow or flow with high spatial variation in velocity or acceleration. If a first baseline image is taken of the area of flow having signal loss, and a second image of the same area is taken by varying an imaging parameter such as repetition time or by varying the type of imaging sequence, such as from gradient echo to spin echo, then the flow in the first and second images will exhibit a different intensity relative to the intensity level of static tissue. The two images can then be used to logically differentiate moving and static protons, thus producing an image which provides information about flow even in regions where disturbed flow significantly reduces the signal intensity.

BRIEF DESCRIPTION OF THE DRAWINGS

The present invention can be better understood with reference to the following drawings. The drawings are not necessarily to scale, emphasis instead being placed upon clearly illustrating principles of the present invention.

FIGS. 6A and 6B are MR images produced by conventional imaging techniques; and

FIGS. 6C and 6D are MR images produced by the inventive flow differentiation process of FIG. 4;

DETAILED DESCRIPTION OF THE PREFERRED EMBODIMENT

Figure 1:
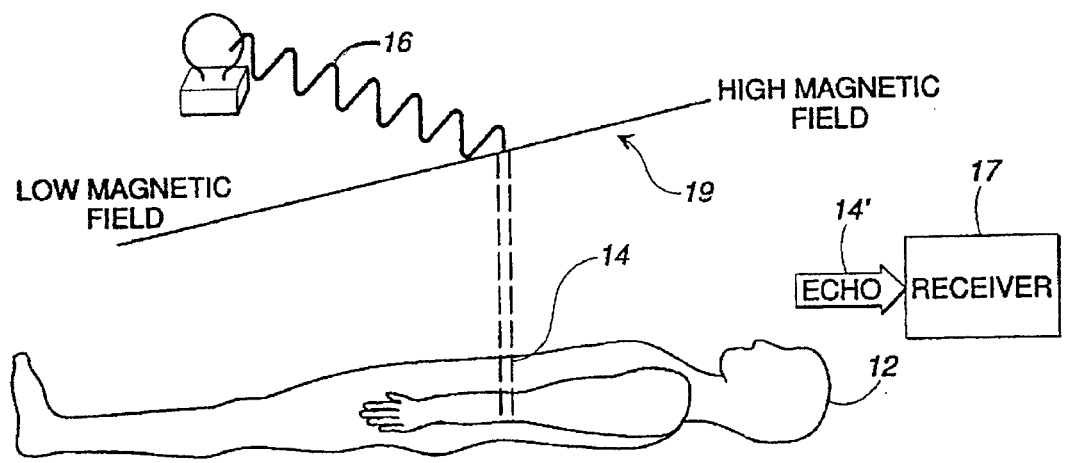
FIG. 1 is a side schematic view illustrating the process of MRI of a body.

Referring now to the drawings wherein like reference numerals designate corresponding parts throughout the several views, FIG. 1 illustrates a conventional magnetic resonance imaging (MRI) process for generating magnetic resonance (MR) images of a body 12, shown by way of example as a person, for the purpose of viewing and analyzing internal pans within the body 12. Needless to say, the principles described hereafter relative to obtaining MR images of the body 12 can be applied to other scenarios for obtaining MR images of virtually anything in virtually any body or thing. When blood vessels are sought to be imaged in a person 12, the process is usually referred to as magnetic resonance angiography (MRA).

MRI generally involves the steps of (1) applying a magnetic field(s) to the body 12 so as to align the rotational axes of protons in the body 12 in a preferential direction, (2) modifying the direction of the rotational axes with magnetic gradients 19 and/or electromagnetic excitation signals (usually RF signals) 16 in a specific slice region 14 of body 12, (3) permitting the protons to recover to their original orientation so that the protons emit an electromagnetic echo signal 14', and (4) receiving and analyzing the electromagnetic echo signal 14' with a receiver 17 in order to generate images of the specific slice region 14 of body 12.

Figure 2:
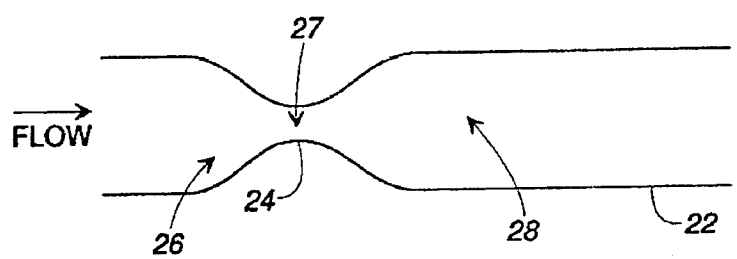
FIG. 2 is a side schematic view showing fluid flow through a channel, such as a blood vessel in the body of FIG. 1.
Figure 3:
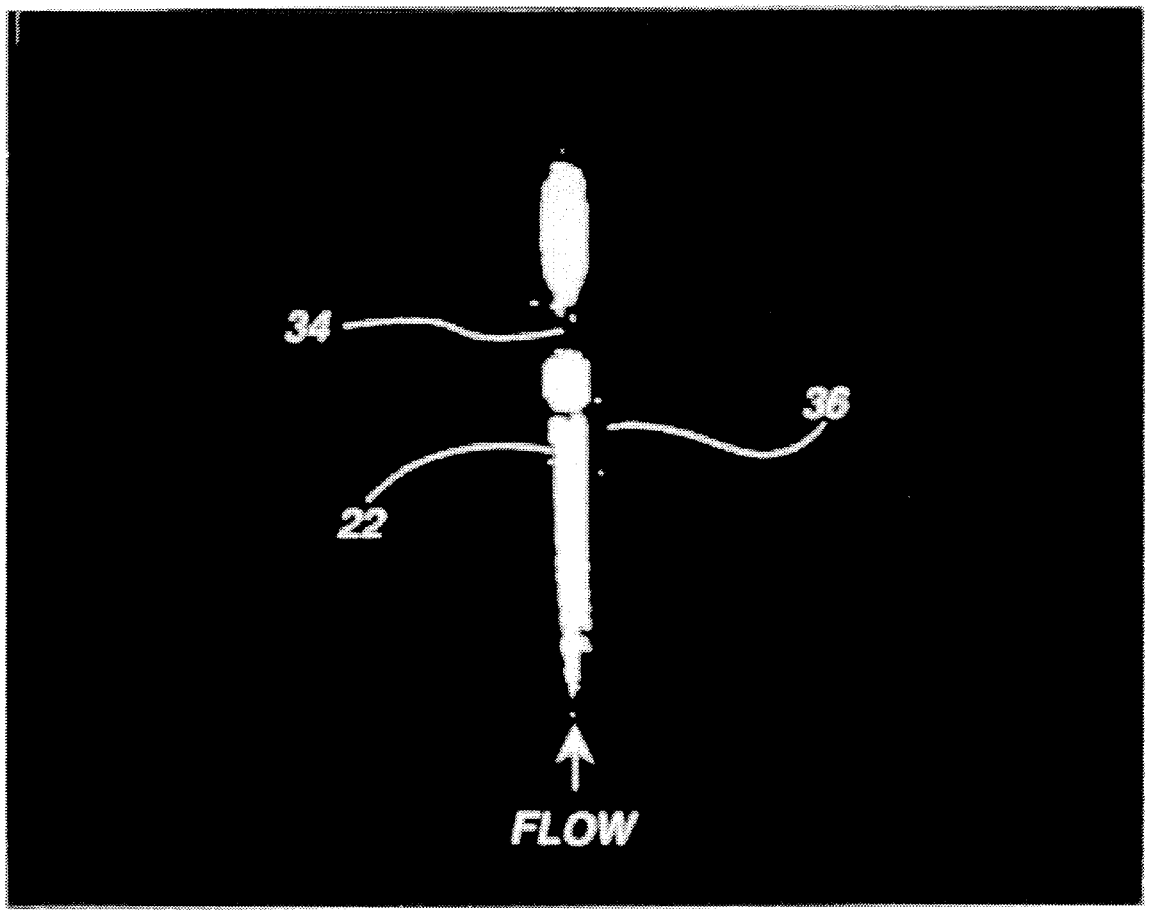
FIG. 3 is a side schematic view showing signal loss in a MR image of a channel, such as a blood vessel in the body of FIG. 1.

As mentioned in the background section hereinbefore, conventional MR imaging methods are unable to clearly and accurately image blood vessels having an arterial disease or constriction where turbulent flow patterns exist. This scenario is best illustrated by referring to, FIG. 2, wherein a blood vessel 22, having flow in the direction indicated, is partially occluded by the constriction 24. The venturi 27 created by constriction 24 produces stenotic flow in regions 26, 28, characterized by ranges in velocity, random acceleration, and pulsatility of flow in the flow field. As a result, a MR image of this portion of blood vessel 22 produces signal loss, making the geometry of the stenosis indistinguishable from surrounding tissue, as illustrated in FIG. 3. A white flow angiogram of blood vessel 22 will show signal loss in the dark region 34 which is indistinguishable from the tissue, bone, and muscle 36 surrounding vessel 22 which signal loss can result in an incorrect diagnosis of the amount of occlusion. According to various studies, trained physicians experience an error rate of over 50% when attempting to diagnose the degree of occlusion in such blood vessels. See, for example, E. Y. Yucel, "Magnetic Resonance Angiography," Perspectives in Vascular Surgery, V. 3, pp. 35–51 (1990).

Figure 4:
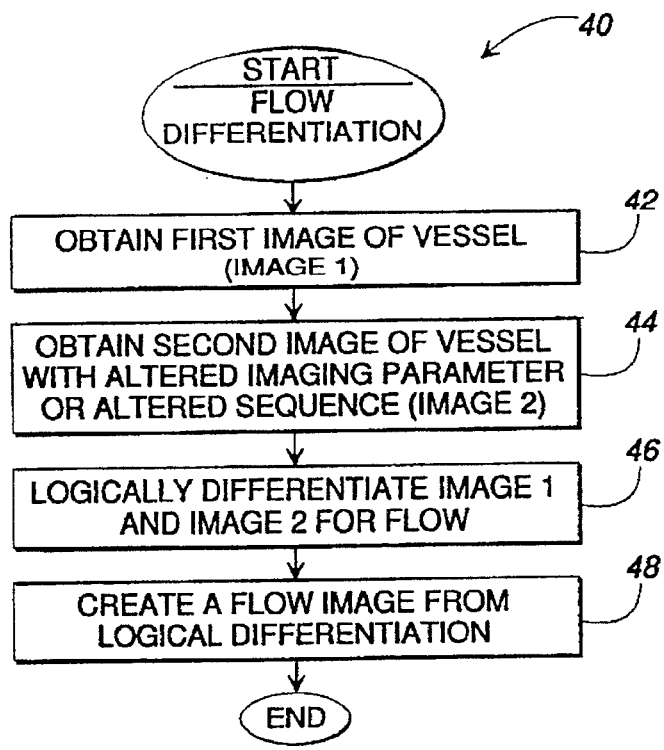
FIG. 4 is a flow chart providing the flow differentiation process of the present invention.

A novel flow differentiating process 40 for producing clear and accurate MR images of diseased vessels without signal loss is illustrated in FIG. 4. The terms black flow and white flow lose their meaning in a flow differentiated image, because the result of the process is an image where static objects contribute nothing to the image, only moving protons contribute to the image. The output can therefore display fluid as a low intensity on a bright background (analogous to black blood) or as a bright intensity on a low background (analogous to white blood).

Referring to the flow chart of the flow differentiation process 40 in FIG. 4, a first image of a vessel is generated in the same manner any conventional MR angiogram is generated, as slated in the step denoted by reference numeral 42. Then, a second image of the same vessel is created by altering one of the imaging parameters or the type of imaging sequence, as stated in the step denoted by reference numeral 44. It has been found that excellent images are produced if the type of sequence is altered, such as going from a gradient echo to a spin echo image. Moreover, it is foreseeable that the two images of the same vessel can be generated simultaneously by the MRA device. The two images are then logically differentiated for flow by logically differentiating moving protons from static protons, as stated in the step denoted by reference numeral 46. For instance, if the first image is a gradient echo image, and the second a spin echo image, the flow returns a signal in the gradient echo image, but not in the spin echo image. Therefore, the logical differentiation step in this case would consist of finding pixels which are "bright" in the first image and "dark" in the second. In the final step, denoted by reference numeral 48, a new flow image is created from logically differentiating the first and second image. An enhanced image can be achieved by superimposing the flow differentiated image upon the original image. It should be noted that the flow differentiation process set forth above may be applied to imaging data either before or after the raw image data is reconstructed via a two-dimensional fourier transform.

Figure 5:
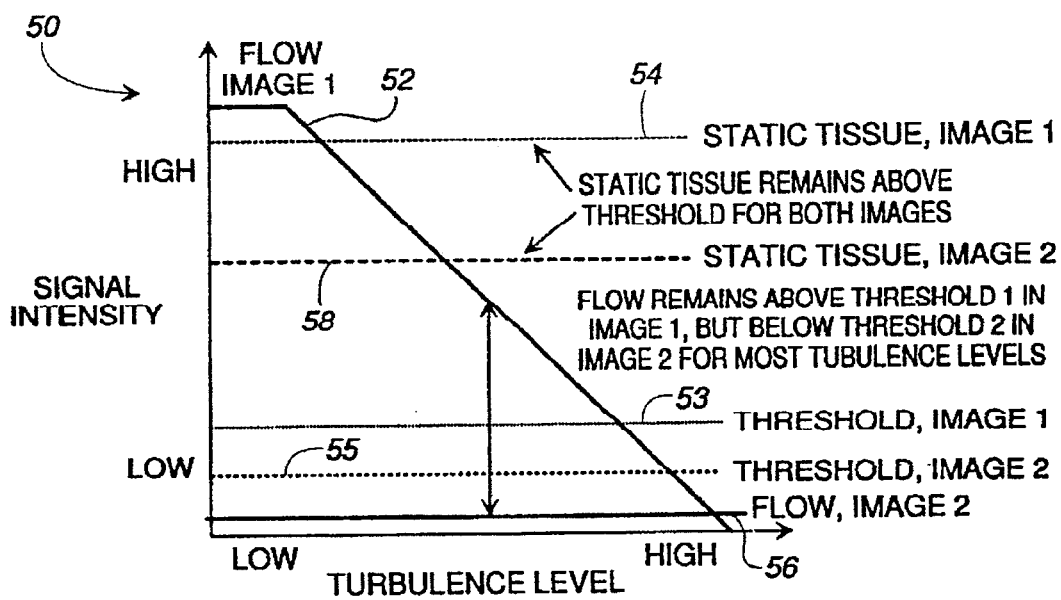
FIG. 5 is a graphical illustration of the signal intensity in relation to turbulence level for a first image generated using a gradient echo imaging sequence and a second image generated using a spin echo imaging sequence.

In development, it was discovered that the signal from regions of disturbed flow in white flow angiograms is low, but not completely lost. Generally, the signal level in a region of disturbed flow is less than the signal level of static material for substances such as water, muscle, fat, or tissue, and therefore, this signal is perceived to be lost. As illustrated in FIG. 5, a graph 50, having the turbulence level plotted on the horizontal axis and signal intensity plotted on the vertical axis, plots the intensity of the signal 52 used to construct image 1 relative to the static tissue level 1, denoted by reference numeral 54. Consequently, when image 1 is generated, the signal below static tissue level 1 is characterized as signal loss and will appear the same as the background, as shown in FIG. 3. Note that threshold intensity levels 53, 54 are set for images 1 and 2, respectively, as the applicable noise levels.

It was then discovered that when an imaging parameter, such as echo time or gradient strength, or an imaging sequence, such as gradient echo to spin echo, is changed and the imaging sequence repeated, the signal level in the turbulent region changes (either increased or decreased) relative to the static tissue level. This concept is graphically illustrated in FIG. 5 by the signal 56 used to generate image 2 and having static tissue level 2, denoted by reference numeral 58. Thus, image 1 and image 2 are of the same region of body 12, but taken with an imaging parameter or the imaging sequence altered so that one image is of greater clarity than the other in reference to contrasting the moving fluid to the stationary background.

The static tissue signal is removed via first applying logical differentiation to image 1 and 2 by comparing the signals 52, 56 to their expected signal intensity levels. If the signal intensity level from a given pixel differs from what would be expected from static tissue, then that pixel is assumed to represent flow. By way of example, in a gradient echo T1 weighted image, the repetition time greatly affects the return signal level of static tissue. In general, the longer the repetition time, the higher the return signal from static tissue. However, rapidly moving fluid passes through the imaging slice 14 during the repetition time, and is therefore unaffected by a change in repetition time. Therefore, if two images are taken with different echo times, the pixels which do not change from the first to the second image and which are above a threshold level are logically assigned to be pixels containing moving fluid.

Though there are many possibilities with regard to altering an imagery parameter or imaging sequence to obtain the second image, a preferred method is described below, wherein the type of imaging sequence is altered.

The first image is taken using a gradient echo white blood technique, and the second image is taken using a spin echo black blood technique. Consequently, the logical differentiation step would involve finding pixels which are above a threshold intensity level in the gradient echo image and below a threshold value in the spin echo image.

The logic involves the following steps, in accordance with flow differentiation process 40 in FIG. 4:

(1) Image a region of interest using a gradient echo white blood technique to produce image 1.

(2) Image same region of interest using a spin echo black blood technique to produce image 2.

(3) Search image 2 for all pixels below a threshold intensity level, for example, search for all pixels below 40 on a 4096 (16 bit) scale.

(4) Search all pixels in image 1 which are below the threshold intensity level in image 2.

If one of these pixels is below the threshold intensity level in image 2, but above the threshold intensity level in image 1, then this pixel is assumed to represent flow and is, in this example, assigned the highest greyscale value. For example, if a pixel in image 2 is below 40, the threshold intensity level in image 2, and the same pixel in image 1 is above the image 1 threshold intensity level 60, then this pixel is assumed to represent flow and is assigned a value of 4095 on a 16 bit scale. A program implementing this process is contained in Appendix A. It should be emphasized that an imaging sequence can be designed which incorporates both images of the same region into a single sequence. For instance, it is simple to design a sequence which sequentially produces a gradient echo image and a spin echo image in the same excitation pulse of a single imaging sequence. The primary focus for our invention is that the two signals are logically analyzed to determine the existence of flow.

Another example of a flow differentiation process would be to image a region using transverse slices and then to image the same region using coronal slices, thus altering the spatial orientation of the images relative to one another. The static material image will not change in intensity level when switching from coronal to transverse slices. Moving protons, however, will change in intensity level because the magnetic gradients are oriented differently with respect to the fluid motion. Therefore, the flow differentiation step in this process would be to search the two images for voxels (this is a 3D process) which change in intensity level between the two images more than a given intensity amount. Those voxels which have that degree of change in intensity level are interpreted as flow.

Actual images produced by the flow differentiation process are shown in contrast with images produced by conventional techniques in FIGS. 6A, 6B, 6C and 6D. Images obtained by imaging a model pediatric coarctation, an arterial deformation where the artery appears to have been "pinched" to a smaller diameter, using conventional imaging techniques show massive signal loss both in the throat and downstream of the occlusion as illustrated in FIGS. 6A and 6B. The image in FIG. 6A is created using transverse slices. The image in FIG. 6B is created using coronal slices. The images in FIGS. 6A and 6B appear to show a second stenosis 61 downstream of the first stenosis 62, and it is unclear whether the artery is completely occluded or simply narrowed. In applying the flow differentiation process, in this case by using a second set of spin echo images, the flow differentiated images clearly show that the arteries are not completely blocked, and that there is in fact no second stenosis. FIG. 6C shows the images created using transverse slices and the novel flow differentiation process 40, and FIG. 6D is the image created using coronal slices and the flow differentiation process. Note that the transverse image is less clear in the region of the throat due to limitations in the resolution.

Once the flow differentiation process is completed and the flow regions are enhanced to provide acceptable contrast, the flow differentiated image may be superimposed upon one of the original images to supply information as to the location of the vessel relative to anatomical reference structures.

The flow differentiation process has also been used successfully to eliminate signal loss caused by flow phenomena other than turbulence. For instance, in a contracting geometry such as seen in a clogged artery, the flow acceleration can cause signal loss. The flow differentiation technique can be used in the acceleration region to eliminate signal loss.

It should be noted that the flow differentiation process can be applied before or after the reconstruction of the image from raw imaging dam. This process is not limited to images which have already been reconstructed.

The present invention can be applied to vessels of a living body as well as those outside a living body such as piping systems, engines or other machines. In regard to its application to imaging vessels of a living body, the flow differentiation process is a particularly significant advancement in isolating and imaging regions of turbulent flow associated with arterial diseases. Additionally, the flow differentiation process provides excellent suppression of the signal from static tissue, and thereby creating angiograms where flow is clearly differentiated from static tissue.

Finally, it will be obvious to those skilled in the art that many other modifications and variations may be made to the preferred embodiment described above without substantially departing from the spirit and scope of the present invention. All such variations and modifications are intended to be included herein and within the scope of the following claims.

APPENDIX A

FOR CORONAL IMAGES
This program produces an angiogram from a gradient echo *
and a spin echo image. The spin echo is used as a mask *
for the gradient echo image

```
#include <stdio.h>
include <math.h> main (argc, argv)
        int argc;
        char *argv[];

FILE                    *fopen(), *fpla, *fplb, *fp2;

char                    *outname,
                                imageAfix[25],
                                imageAPfix[25],
                                imageAMfix[25],
                                imageBPfix[25],
                                imageBMfix[25],
                                imageBfix[25];

unsigned char           *vax_imagea,
                                *vax_imageb,
                                *out_image;

short int               *swapped_imagea,
                                *swapped_imageb;

float           *back_image,
                                pixelmax,
                                backtmp,
                                tmpa,
                                tmpb,
                                avgtot,
                                stdtotal,
                                std,
                                pixavg,
                                count,
                                backA,
                        backBtoA,
                                threshold;

int                     num_pixels,
                                imageA,
                                imageB,
```

- 12 -

```
                        image_size,
                        kk,
                        numslices,
                        num_read,
                        num_write,
                        xupleft,
                        skip,
                        byteskip,
                        yupleft,
                        bwidth,
                        res,
             row,
             col,
             x_center,
                        y_center,
                        maskrad,
                        mask_dist_sqd,
                        row_dist_sqd,
                        col_dist_sqd,
                        distance_from_center,
                        ndx;

if (argc <11) {
             printf("\nUSAGE\n");
             printf("gese imageA imageB outname threshold xcen ycen
maskrad skip backB backA numslices\n\n");
             printf("Creates an output image by using a spin echo image as
a filter for a gradient echo image\n");
             printf("THIS VERSION IS FOR CORONAL IMAGES\n");
             printf("imageA-(imageB/backBtoA)\n\n");
             printf(" imageA    = gradient echo image.\n");
             printf(" imageB    = spin echo image.\n");
             printf(" outname   = outfile name.\n");
             printf(" threshold = fraction of max intensity at which to
threshold image.\n");
             printf("            (ie.10 =  threshold at 10 percent max
intensity).\n");
             printf("                     set threshold = 0 to turn off.\n");
             printf(" xcen,ycen = x and y center of tube\n");
             printf(" maskrad   = radius around center to mask image\n");
             printf(" skip      = number of frames to skip in image
file\n");
             printf(" backBtoA  = ratio of background of B to background
of A\n");
             printf(" backA     = background level of image A\n");
             printf(" numslices = total number of slices in image\n");

exit(0);
```

```
                }
                sscanf(argv[1],"%d",&imageA);
                sscanf(argv[2],"%d",&imageB);
      outname = argv[3];
                sscanf(argv[4],"%f",&threshold);
                sscanf(argv[5],"%d",&x_center);
                sscanf(argv[6],"%d",&y_center);
                sscanf(argv[7],"%d",&maskrad);
                sscanf(argv[8],"%d",&skip);
                sscanf(argv[9],"%f",&backBtoA);
                sscanf(argv[10],"%f",&backA);
                sscanf(argv[11],"%d",&numslices);

res=256;
                pixelmax=0;
                count=0;
        mask_dist_sqd_maskrad*maskrad;

printf("slice#=%d\n\n",skip+1)) {
        if(fp2=fopen( outname, "r")) {
                printf("\nERROR: The file \"%s\" already exists.\n", outname);
                printf("     Delete this file or provide a different output
filename.\n");
                exit(0);
        }
        /*else fclose(fp2);*/ fp2=fopen(outname , "w");

sprintf(imageAfix,"%dfix.rec",imageA);
        sprintf(imageBfix,"%dfix.rec",imageB);

num_pixels              =       res*res;
                image_size              =       num_pixels*2;
                byteskip                =       image_size*skip;

vax_imagea              = ( u n s i g n e d    c h a r
*)calloc(image_size,sizeof(unsigned char));

vax_imageb              = ( u n s i g n e d    c h a r
*)calloc(image_size,sizeof(unsigned char));

out_image               =(unsigned    char *)calloc(num_pixels,
sizeof(unsigned char));
                back_image              =(float*)calloc(num_pixels,sizeof(float));
```

- 14 -

```
swapped_imagea = (short*)calloc(num_pixels,sizeof(short));
swapped_imageb = (short*)calloc(num_pixels,sizeof(short));

/*initialize back_image to 0*/
for (kk = 0; kk < num_pixels; kk ++) back_image[kk] = 0.0;

fpla = fopen(imageAfix,"r");                           fpla
= fopen(imageBfix,"r");

fseek(fpla,byteskip,0);
num_read = fread(vax_imagea,sizeof(*vax_imagea),image_size,fpla);
        if (num_read<image_size) {
        printf("\nError reading image file. Exiting\n");
        exit(0);
        } fseek(fplb,byteskip,0);
num_read = fread(vax_imageb,sizeof(*vax_imageb),image_size,fplb);
                if (num_read<image_size) {
                printf("\n Error reading image file. Exiting\n");
                exit(0);
                } swab(vax_imagea,swapped_imagea,image_size);
        swab(vax_imageb,swapped_imageb,image-size);

count=0;

for (row=0;row/<res;row++) { ndx=row*res;
                row_dist_sqd=(y_center-row)*(y_center-row);
                for(col=0;col<res;col++) { col_dist_sqd=(x_center-col)*(x_center-col);
                        distance_from_center=row_dist_sqd+col_dist_sqd;

if (distance_from_center<mask_dist_sqd) [ tmpb=0;

if (float)swapped_imageb[ndx+col]>20II
(float)swapped_imageb[ndx+2*res+col]>20
                                II(float)swapped_imageb[ndx-2*res+col]>20
II(float)swapped_imageb[ndx+col+2]>20II
                                (float)swapped_imageb[ndx+col-2]>20)tmpb=1;

if (tmpb=0) {
```

- 15 -

```
                back_image[ndx+col]=(float)swapped_imagea[ndx+col];
                    }
                }
            }
        } for (row=0;row<res;row++) { ndx=row*res;
            row_dist_sqd=(y_center-row)*(y_center-row);
            for(col=0;col<res;col++) { col_dist_sqd=(x_center-col)*(x_center-col);
                distance_from_center=row_dist_sqd+col_dist_sqd;
                if (distance_from_center<mask_dist_sqd)
                        if(back_image[ndx+col] > pixelmax)
pixelmax=back_image[ndx+col];
            if(pixelmax>255.0)
                    for (kk=0;kk<num_pixels;kk++)out_image[kk]=(unsigned
char)(255*back_image[kk]/pixelmax);
else    for    (kk=0;kk<num_pixels;kk++)out_image[kk]=(unsigned
char)back_image[kk];

if (threshold!=0)    for    (kk=0;kk<num_pixels;kk++)    {if
((float)out_image[kk]>threshold*255)out_image[kk]=255;
                                        else out_image[kk]=0;} num_write=fwrite(out_image,sizeof(*out_image),num_pixels,fp2);
            if (num_write<num_pixels) {
                    printf("\n Error writing new image file. Exiting\n");
                    exit(0);

} fclose(fp2);
        }
```

The following is claimed:

1. A process for producing a magnetic resonance image of a region of fluid flow, comprising the steps of:

generating a first set of signals representing a first magnetic resonance image of said region of fluid flow;

generating a second set of signals representing a second magnetic resonance image of said region of fluid flow such that signal intensities of said second set of signals for said region of fluid flow differ from signal intensities of said first set of signals for said region of fluid flow;

comparing said first set of signals to a first threshold level to distinguish static material from fluid flow;

comparing said second set of signals to a second threshold level to distinguish static material from fluid flow;

logically differentiating said first set of signals from said second set of signals by differentiating protons in said fluid flow from other protons; and producing an image of said region of fluid flow from said logically differentiating step;

wherein said step of producing said image comprises the step of displaying portions of said region as having fluid flow when signals in said second set of signals for the portions are below said second threshold level but signals in said first set of signals for said portions are above said first threshold.

2. The process of claim 1, wherein the step of generating said second set of signals comprises a step of using an imaging sequence different than said an imaging sequence used in said set of generating said first set of signals.

3. The process of claim 2, wherein said step of generating said first set of signals uses a gradient echo sequence and said step of generating said second set of signals uses a spin echo imaging sequence.

4. The process of claim 1, further comprising steps of generating a first image based upon said first set of signals and superimposing said first image upon said flow image.

5. The process of claim 1, further comprising steps of generating a second image based upon said second set of signals and superimposing said second image upon said flow image.

6. The process of claim 1, wherein said region is within a body and said process further comprises steps of displaying merely portions of the region where the first set of signals were below said first threshold level and mapping the location and severity of arterial disease in said body.

7. The process of claim 1, wherein the step of logically differentiating occurs before a step of generating first and second images based upon said first and second set of signals, respectively.

8. The process of claim 1, wherein the step of logically differentiating occurs after a step of generating first and second images based upon said first and second set of signals, respectively.

9. A system for producing a magnetic resonance image of a region of fluid flow, comprising:

means for generating a first set of signals representing a first magnetic resonance image of said region of fluid flow;

means for generating a second set of signals representing a second magnetic resonance image of said region of fluid flow such that signal intensities of said second set of signals for said region of fluid flow differ from signal intensities of said first set of signals for said region of fluid flow;

means for comparing said first set of signals to a first threshold level to distinguish static material from fluid flow;

means for comparing said second set of signals to a second threshold level to distinguish static material from fluid flow;

means for logically differentiating said first set of signals from said second set of signals by differentiating protons in said fluid flow from other protons; and means for producing an image of said region of fluid flow from said logically differentiating step;

wherein said producing means displays portions of said region as having fluid flow when signals in said first set of signals for the portions are below said first threshold but signals in said second set of signals for the portions are above said second threshold.

10. The system of claim 9, wherein said means for generating said second set of signals has an imaging sequence different than an imaging sequence used by said means for generating said first set of signals.

11. The system of claim 9, wherein said means for generating said second set of signals has a gradient echo imaging sequence and said means for generating said first set of signals has a spin echo imaging sequence.

12. The system of claim 9, further comprising means for generating a first image from said first set of signals and means for superimposing said first image upon said flow image.

13. The system of claim 9, further comprising means for generating a second image from said second set of signals and means for superimposing said second image upon said flow image.

14. The system of claim 9, wherein said region is within a body and said system further comprises means for displaying merely portions of the region where the first set of signals were below said first threshold level and means for mapping the location and severity of arterial disease in said body.

15. A system for producing a magnetic resonance image of fluid flow within a body, comprising:

means for creating a first magnetic resonance image of said flow within a region of said body using a first repetition time, static tissue in said body returning a first signal intensity which is in contrast with a signal intensity of fluid flow in said body;

means for creating a second magnetic resonance image of said region of said body using a second repetition time such that said static tissue produces a second signal intensity different than said first signal intensity;

means for comparing said first image with said second image to locate a first group of pixels in said first image which are above a threshold level and which are equal in magnitude to a second group of pixels located in corresponding positions in said second image; and means for producing a flow image by displaying said first group of pixels as representing fluid flow in said body.

16. The system of claim 15, further comprising a means for superimposing said first magnetic resonance image upon said flow image.

17. The system of claim 15 further comprising a means for superimposing said second magnetic resonance image upon said flow image.

18. The system of claim 15, wherein said first group of pixels represent static tissue in said first magnetic resonance image of said flow.

* * * * *